(12) United States Patent
Bastke et al.

(10) Patent No.: US 11,959,190 B2
(45) Date of Patent: Apr. 16, 2024

(54) DEVICE FOR CONNECTING A SUSCEPTOR TO A DRIVE SHAFT

(71) Applicant: AIXTRON SE, Herzogenrath (DE)

(72) Inventors: Torsten Werner Bastke, Würselen (DE); Francisco Ruda Y Witt, Eschweiler (DE); Mike Pfisterer, Würselen (DE)

(73) Assignee: AIXTRON SE, Herzogenrath (DE)

( * ) Notice: Subject to any disclaimer, the term of this patent is extended or adjusted under 35 U.S.C. 154(b) by 937 days.

(21) Appl. No.: 16/964,152

(22) PCT Filed: Jan. 22, 2019

(86) PCT No.: PCT/EP2019/051433
§ 371 (c)(1),
(2) Date: Jul. 22, 2020

(87) PCT Pub. No.: WO2019/145271
PCT Pub. Date: Aug. 1, 2019

(65) Prior Publication Data
US 2021/0032771 A1    Feb. 4, 2021

(30) Foreign Application Priority Data
Jan. 23, 2018    (DE) .................... 20 2018 100 363.1

(51) Int. Cl.
*H05B 6/80*    (2006.01)
*C23C 16/458*    (2006.01)
(Continued)

(52) U.S. Cl.
CPC .......... *C30B 25/12* (2013.01); *C23C 16/4584* (2013.01); *C23C 16/4586* (2013.01)

(58) Field of Classification Search
CPC . C23C 16/4584; C23C 16/4586; C30B 25/12; H05B 6/64; H05B 6/80
(Continued)

(56) References Cited

U.S. PATENT DOCUMENTS 5,762,544 A    6/1998   Zuniga et al.
7,981,218 B2 *  7/2011   Yamashita .......... C23C 16/4586
                                             219/390
(Continued)

FOREIGN PATENT DOCUMENTS

DE    10 2005 056 324 A1    6/2007
JP          2544794 B2 * 10/1996 ............. B05C 11/00
(Continued)

OTHER PUBLICATIONS

International Search Report dated Apr. 4, 2019, from the ISA/European Patent Office, for International Application No. PCT/EP2019/051433 (filed Jan. 22, 2019), 8 pgs.
(Continued)

*Primary Examiner* — Quang T Van
(74) *Attorney, Agent, or Firm* — Ascenda Law Group, PC

(57) ABSTRACT

A device is provided to fasten a susceptor of a CVD reactor to a drive shaft, and by the device, the susceptor can be set into rotation. The device includes one or more of a base plate, a support plate, adjusting levers, and a flange element. The drive shaft carries the base plate, to which the support plate, which carries the susceptor, is fastened. The inclination of the support plate relative to the base plate can be adjusted by the adjusting levers. The support plate is connected to the flange element by a screw. A through opening aligned with the screw is closed with a plug.

17 Claims, 9 Drawing Sheets

(51) Int. Cl.
*C30B 25/12* (2006.01)
*H05B 3/68* (2006.01)

(58) Field of Classification Search
USPC ....... 219/634, 635, 638, 647, 651, 652, 659,
219/121.4, 121.51, 730, 745, 756, 759,
219/539, 541, 544, 548, 444.1
See application file for complete search history.

(56) References Cited

U.S. PATENT DOCUMENTS

| | | | |
|---|---|---|---|
| 9,765,427 | B2 | 9/2017 | Yamaguchi et al. |
| 2003/0029384 | A1 | 2/2003 | Nishikawa |
| 2008/0017117 | A1 | 1/2008 | Campbell et al. |
| 2016/0020137 | A1 | 1/2016 | Halpin |
| 2016/0091014 | A1 | 3/2016 | Huang |
| 2016/0138159 | A1 | 5/2016 | Kato et al. |

FOREIGN PATENT DOCUMENTS

| | | |
|---|---|---|
| WO | 2018/022577 A1 | 2/2018 |
| WO | 2019/145271 A1 | 8/2018 |

OTHER PUBLICATIONS

Written Opinion dated Apr. 4, 2019, from the ISA/European Patent Office, for International Application No. PCT/EP2019/051433 (filed Jan. 22, 2019), 8 pgs.

Written Opinion dated Apr. 4, 2019, from the ISA/European Patent Office, for International Application No. PCT/EP2019/051433 (filed Jan. 22, 2019), English translation, 8 pgs.

International Preliminary Report on Patentability dated Jul. 28, 2020, from The International Bureau of WIPO, for International Application No. PCT/EP2019/051433 (filed Jan. 22, 2019), 9 pgs.

\* cited by examiner

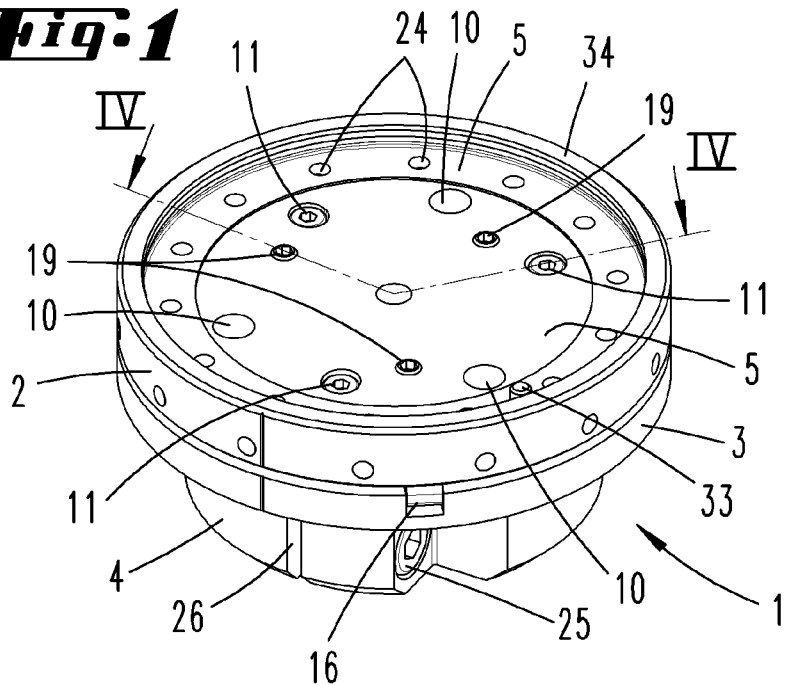
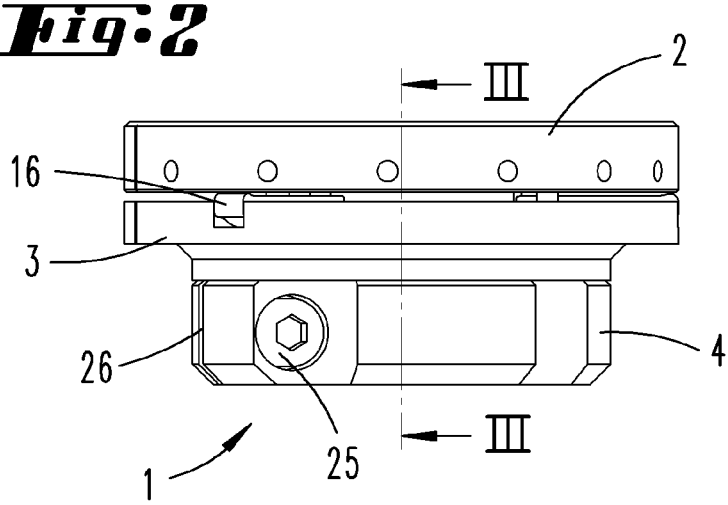

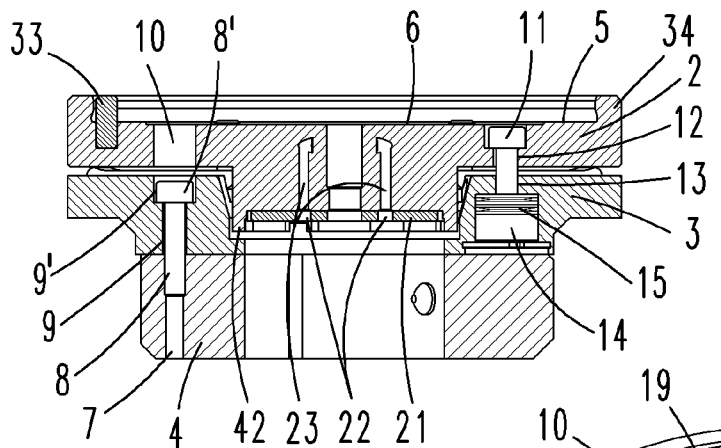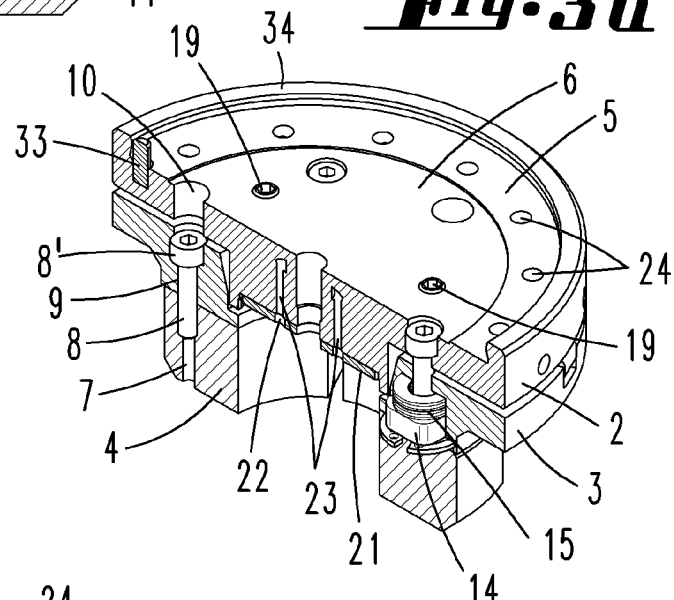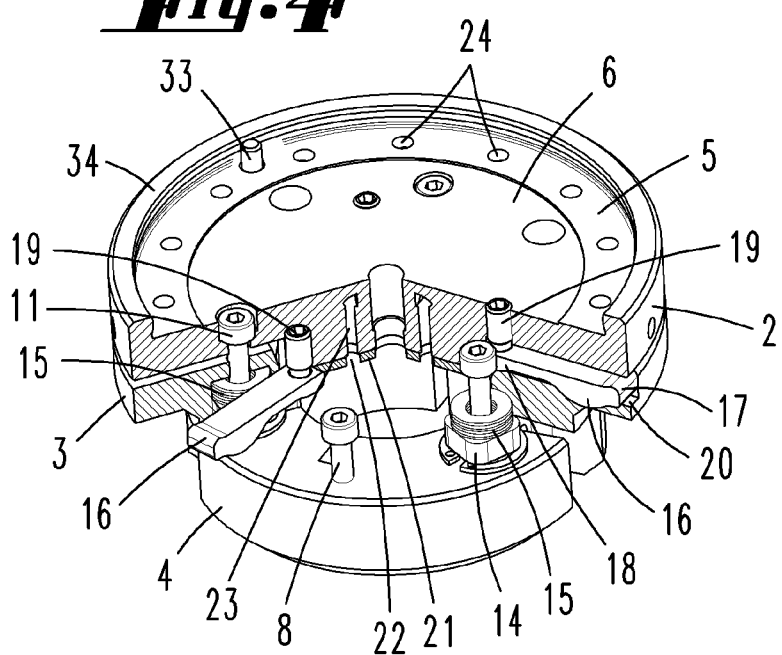

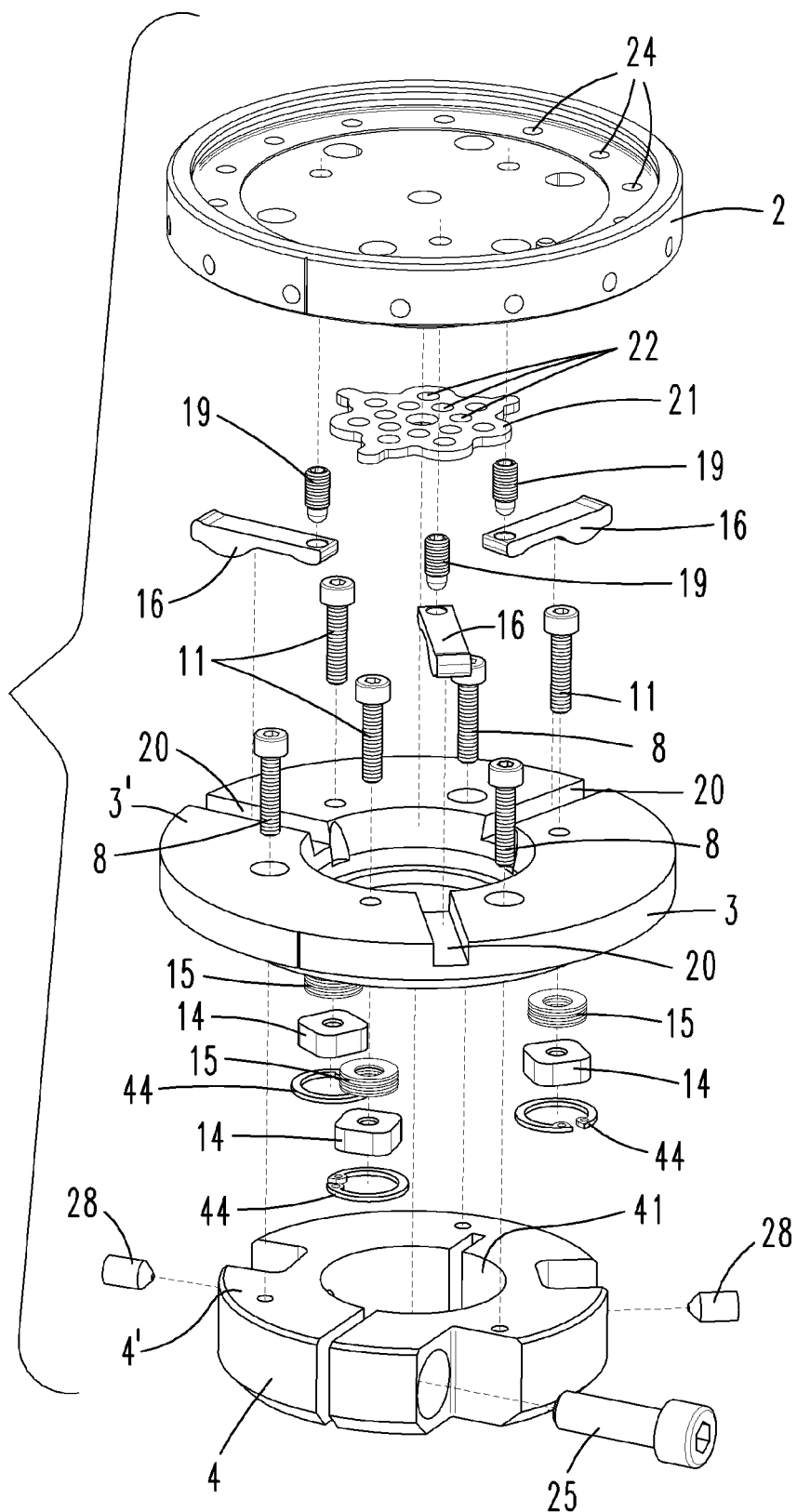

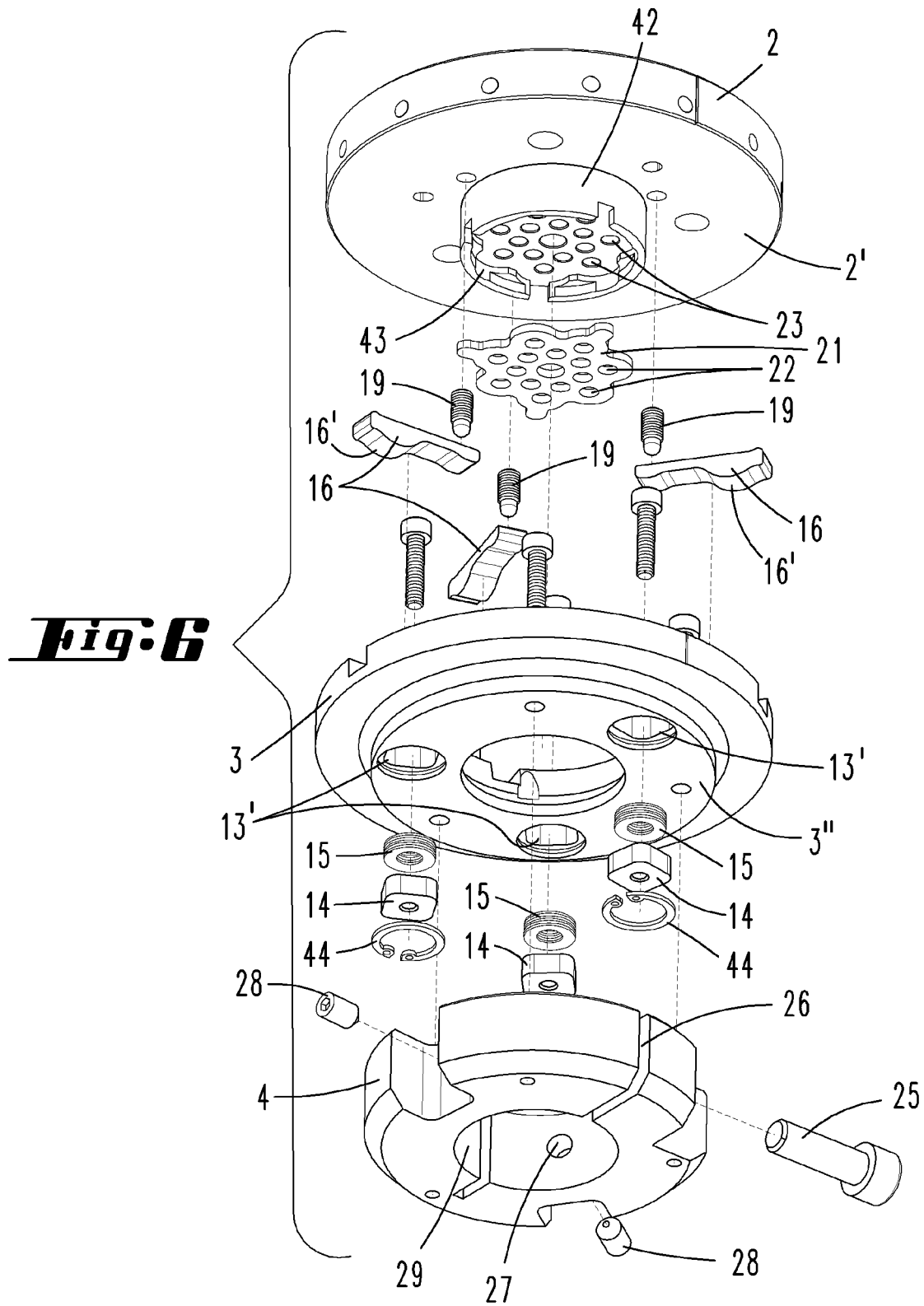

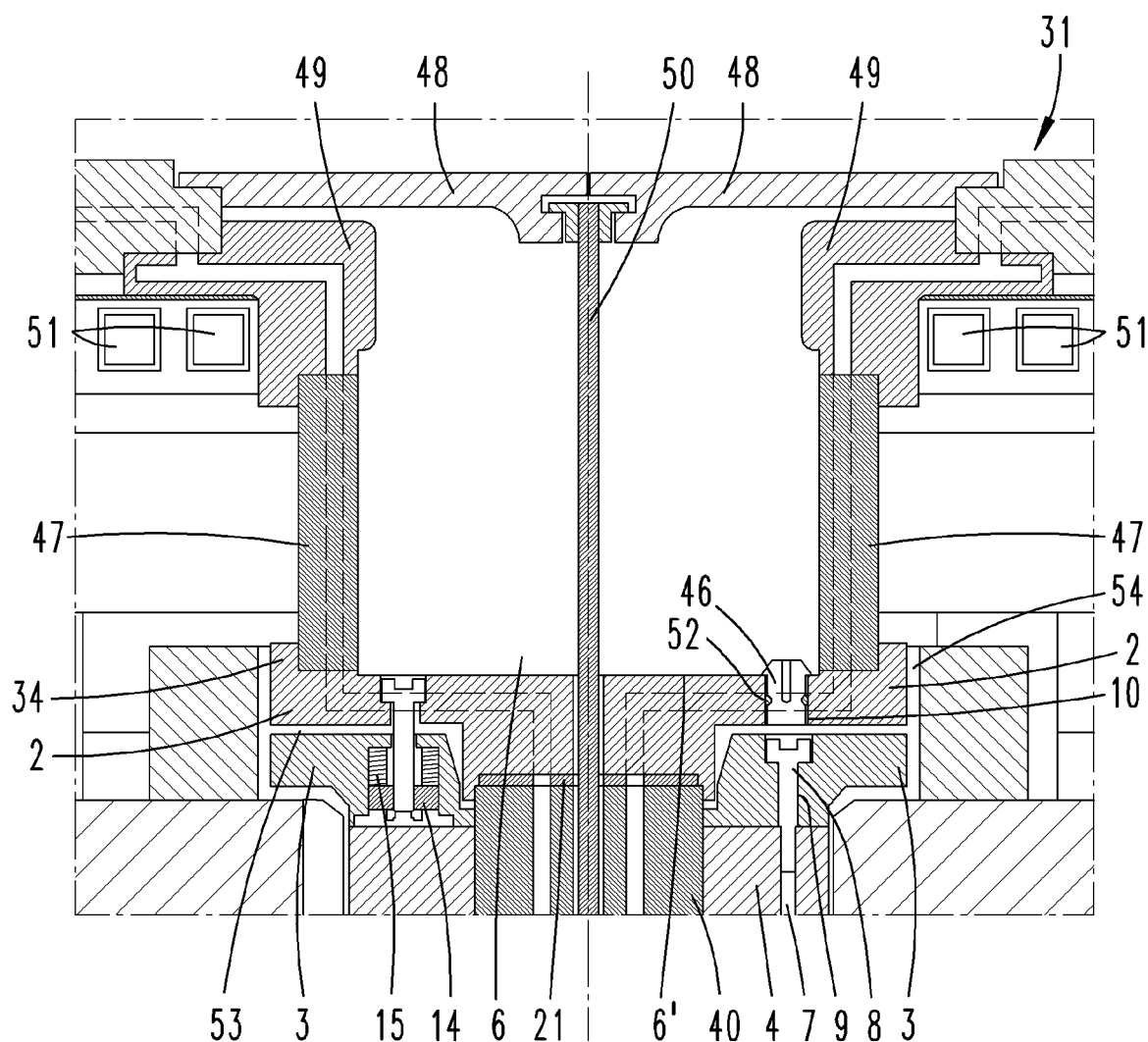

DEVICE FOR CONNECTING A SUSCEPTOR TO A DRIVE SHAFT

RELATED APPLICATIONS

This application is a National Stage under 35 USC 371 of and claims priority to International Application No. PCT/EP2019/051433, filed 22 Jan. 2019, which claims the priority benefit of DE Application No. 20 2018 100 363.1, filed 23 Jan. 2018.

FIELD OF THE INVENTION

The invention relates to a device for the attachment of a susceptor of a CVD reactor to a drive shaft, with a support plate, which has a bearing surface, on which a supporting face of the susceptor can be placed, and with a base plate, which can be connected to the drive shaft, and by which the support plate is supported in an adjustable position.

The invention further relates to a CVD reactor with a reactor housing, a susceptor, and a drive shaft connected to a susceptor carrier.

BACKGROUND

US 2008/0017117 A1 describes a CVD reactor with a susceptor, which is attached to a rotatable drive shaft, and with means for adjusting the position of the drive shaft.

U.S. Pat. No. 9,765,427 B2 describes a CVD reactor with a reactor housing within which a susceptor is arranged. The susceptor carries a multiplicity of substrate carriers, which can be rotated about an axis by a drive. The susceptor is connected, with a susceptor carrier, to the front face of a shaft. Means are provided so as to adjust the position of the susceptor relative to the shaft.

The prior art also includes WO 2018/022577 A1, US 2003/0029384 A1, U.S. Pat. No. 5,762,544 A and US 2016/0138159 A1.

A CVD reactor of the generic type serves for the deposition of III-V layers, and in particular for the deposition of gallium nitride layers on substrates. The diameter of a susceptor of a generic CVD reactor can be 30 cm or more. The distance between a process chamber cover and the floor of the process chamber formed by the susceptor is approximately 10 to 50 mm, preferably 30 to 40 mm. The gas is fed into the process chamber through a gas inlet device arranged in the center of the process chamber, with which a hydride of the V-main group and an organometallic compound of the III-main group are fed separately into the process chamber. In industrial production, the wafers produced in a batch, which are arranged in a circle around the center of the process chamber on the susceptor, must be coated in a consistent manner. The coating is achieved by the pyrolytic decomposition of the process gases introduced into the process chamber, in particular on the heated surface of the substrates. In order to achieve a lateral homogeneity of the deposited layers, a parallel positioning of the susceptor surface and the lower face of a reactor cover that is as exact as possible is required. The reactor cover preferably extends in a plane of rotation of the drive shaft, which drives the susceptor in rotation. A susceptor of a generic CVD reactor has a supporting face, which faces downwards, and which rests on a bearing surface of a susceptor carrier supported by the drive shaft. As a result of manufacturing tolerances, the supporting face is usually not exactly parallel to the upper face of the susceptor, which forms the floor of the process chamber. The susceptor carrier must therefore have means to adjust the inclined position of the susceptor relative to the drive shaft.

SUMMARY OF THE INVENTION

The object underlying the invention is that of the further development of a generic susceptor carrier in a manner advantageous to use.

The object is achieved by the invention specified in the claims, wherein the subordinate claims represent not only advantageous further developments of the independent claims 1 and 16, but also autonomous achievements of the object.

First and foremost, it is proposed that the susceptor carrier has three elements arranged axially one behind the other relative to the axis of the drive shaft. A lower element is attached to the drive shaft. This lower element carries a central element, which rests in particular on a plane surface of the lower element. The central element in turn carries an upper element, which forms the bearing surface on which the susceptor is supported. Means are provided for the adjustment of at least the inclined position of the upper element relative to the central element. The lower element is preferably a flange element, which can be attached to the drive shaft. However, the drive element can also be attached to the drive shaft. In particular, the flange element is permanently attached to the drive shaft. The central element, which forms a base plate, and the upper element connected to it, which is formed by a support plate, can be removed from the flange element and releasably connected to the flange element. The position of the support plate can be adjusted relative to the base plate by means of the adjustment elements outside the CVD reactor housing. It is therefore possible to perform an initial adjustment outside the reactor housing, in which, for example, the bearing surface of the support plate is brought into a position parallel to a seating face of the base plate, with which the base plate rests on the bearing surface of the flange element. When replacing a susceptor from a CVD reactor, the position of the support plate relative to the base plate can thus be initially adjusted in a first step. The ensemble consisting of the support plate and base plate can be inserted into the process chamber as a unit, wherein the seating face of the base plate rests on the bearing surface of the flange element. The susceptor with its supporting face can subsequently be rested on the bearing surface of the support plate. However, it is also possible to connect the ensemble consisting of the support plate and base plate externally to the susceptor, and then to insert the module thus formed into the CVD reactor, and to position it on the bearing surface of the support element. Before the final position adjustment is made, the base plate can be connected to the flange element. Means of attachment are provided for this purpose. These take the form of releasable means of attachment. The means of attachment can have a plurality of screws, which are inserted into mounting holes of the base plate, and screwed into threaded holes of the flange element. Here the mounting screws can have heads, which are inset in enlarged diameter sections of the mounting holes. The mounting holes therefore take the particular form of stepped holes within the base plate. The mounting holes and the threaded holes preferably run parallel to the axis of the drive shaft. An end face of the support plate, facing away from the base plate, can have a central region, which in particular is surrounded by the bearing surface. Through openings can be arranged in this central region, through which the attachment screws can be inserted, if they are to be inserted into the mounting holes and screwed into the threaded holes of the flange element. The enlarged diameter sections of the mounting holes preferably have an axial depth such that the screw heads are completely accommodated therein. The means for adjustment of the inclination of the bearing surface relative to the seating face of the base plate, which rests on the bearing surface of the flange element, can preferably be accessible from the central region. The means for adjustment of the inclination can preferably be actuated with a tool, which acts in the direction of the drive axis. The means for adjustment of the inclination can take the form of screws, whose screwdriver engagement openings are accessible from the central region. These screws preferably extend parallel to the axis of the drive shaft. They can take the form of grub screws. Provision can be made for a lever transmission in order to be able to adjust the position more sensitively. In order to avoid static over-constraints, three means for adjusting the inclination are provided at angular intervals of 120°, wherein in particular, these means have levers extending in a radial direction. The levers form adjusting levers, which are preferably supported on the base plate. A short lever arm can be directed in a radially outward direction. A long lever arm can be directed in a radially inward direction. In a radially outer region the short lever arm engages with the lower face of the support plate. The long lever arm is preferably acted upon by an adjusting screw, which in particular is formed by a grub screw, and which is screwed into a threaded hole of the central region. The adjusting screw, which acts on the long lever arm, preferably has a shaft, which is rounded on the end face, and which lies in a recess of the long lever arm. In a further development of the invention, provision is made for the support plate to be subjected to a force in the direction of the base plate. Traction elements preferably serve this purpose. The traction elements can take the form of screws, which are screwed into sliding blocks, which can move in the axial direction in a bearing recess of the base plate. Preference is given to spring elements, and in particular to compression spring elements, which are arranged between a sliding block and a floor of the bearing recess. It is preferable to have three traction elements arranged in an even angular distribution around the center of the base plate or support plate. The flange element can be connected to, in particular, an end section of the drive shaft by way of suitable means of attachment. The flange element is preferably connected to the drive shaft by way of clamping elements. The clamping elements can act on an outer peripheral surface of the drive shaft. Two clamping jaws can be provided, which can be moved towards each other with a clamping device, for example a clamping screw. In a clamping position, the clamping jaws interact with the drive shaft in a clamping manner. Screws extending in a radial direction, in particular grub screws, can be provided, which perform the function of clamping screws, which can be brought against the outer peripheral surface of the drive shaft. In particular, the clamping screws are adjustable in a radial direction. In a further development of the invention, provision is made for the susceptor to be a carrier of a multiplicity of substrate carriers. Each substrate carrier carries one or a plurality of substrates, and is inserted in a pocket of the susceptor. A gas supply line opens onto the floor of the pocket, through which line a carrier gas can be fed into the pocket. The carrier gas forms a gas bearing, on which the susceptor carrier rests such that it can rotate. The gas outlet nozzle in the floor of the pocket has a direction such that the gas exiting from it sets the substrate carrier in rotation. The gas supply lines run in a radial direction from a central opening of the susceptor to the gas outlet openings on the floor of the pockets. The inert gas is fed in through the support plate. For this purpose, the support plate has gas channels extending in a radial direction, which open onto the bearing surface. Alternatively, however, it is also possible for the gas channels to open onto a cylindrical peripheral wall of the support plate. They are aligned with the flow channels in the susceptor, through which the gas is transported to the pockets. The gas channels inside the support plate have gas inlet openings, which are located on the lower face of the support plate. In particular, provision is made for an extension to be located on the lower face of the support plate, which extension forms an axial end face, onto which the gas channels open. Gas inlet openings are formed located in one plane, through which openings the inert gas can be fed into the gas channels and subsequently into the flow channels. The plane in which the gas inlet openings are located is preferably a floor plane of a cavity. A seal is provided, which has gas passage openings, which are aligned with the gas inlet openings of the gas channels. The seal is located between the plane in which the gas inlet openings are located, and an end face of the drive shaft, which has an axial cavity, through which the gas can flow into the gas passage openings of the seal and subsequently into the gas channels. The seal is produced from a flexible material. The extension formed on the lower face of the support plate engages with a central hole in the base plate. The lower face of the support plate is spaced apart from an upper face of the base plate by a gap. The outer edge of the lower face of the support plate rests on upward-facing extensions of the short lever arms of the adjusting levers. The upper face of the support plate has an annular web along the outer edge, following a circular contour line. This annular web can engage with an annular recess in the lower face of the susceptor. An orientation element, for example an orientation pin, is preferably provided, which is assigned to the upper face of the support plate, and which corresponds with a mating orientation element, for example an orientation opening, on the lower face of the susceptor. This ensures that the susceptor can only be assigned to the susceptor carrier in one unique rotational position. The flange element, the base plate, and the support plate, are preferably produced from metal. They can be produced from stainless steel. However, they can also consist of another metal and can be coated. The seal preferably consists of rubber, so that it takes the form of a rubber seal. It is elastic such that the flange arrangement, that is to say the support plate, can be adjusted a number of times relative to the base plate, that is to say the drive shaft, or the shaft to which the flange element is attached, without the rubber seal wearing out. The rubber seal is clamped between support plate, base plate or flange element or shaft, that is to say, drive shaft, such that gas impermeability is ensured. The shaft, that is to say the drive shaft, can be open at the top. However, It is also possible that the drive shaft, that is to say, the shaft is closed on the end face, wherein the closure plate closing the end face has openings, which are aligned with the gas inlet openings of the flow channel in the support plate. Instead of a flexible seal, for example a polymer seal, which can develop a restoring force, a plastically deformable seal, for example a graphite seal, can also be used.

For purposes of achieving the object, it is proposed in particular that, on a generic device for the attachment of a susceptor of a CVD reactor to a drive shaft, with a support plate, which has a bearing surface, on which a supporting face of the susceptor can be positioned, and with a base plate, which can be connected to a drive shaft, and by which the support plate is supported in an adjustable position, at least one adjusting lever is provided, which is mounted on a bearing point, and, starting from the bearing point, has a long lever arm and a short lever arm, wherein an adjusting element, for example an adjusting screw, acts on the long lever arm, by means of which adjusting element a gap between the base plate and the support plate can be adjusted in terms of gap width, wherein the bearing point is assigned either to the support plate or to the base plate, and the short lever arm acts on the respectively other plate, to which other plate the adjusting element is preferably also attached.

The invention further relates to a device for the attachment of a susceptor of a CVD reactor to a drive shaft, with a base plate, which can be connected to the drive shaft by way of a screw, and a support plate, which is spaced apart from the base plate by a gap, supports the susceptor, and can be altered in position relative to the base plate, wherein the support plate has a through opening aligned with a mounting hole of the base plate for the passage of the screw.

Such a device can support the susceptor, in particular with the interposition of an annular support element, wherein the support element is supported on a floor surface of a central region of the support plate. On the annular support element, through which gas channels can run, a support piece assigned to the susceptor can be supported, which support piece carries an annular susceptor plate. On an edge region of the annular susceptor plate, the edge region of a tensioning piece can be supported, which with a tensioning element, in particular a tie rod, is connected to the drive shaft or traction unit. The annular supporting element forms a cavity, which is connected via the through opening and the gap to a space underneath the susceptor, in which a heating device is located.

The object is to avoid flow connections between the cavity above the support plate and the space underneath the susceptor.

The object is achieved by the features specified in claim 18, wherein means of closure are provided to close the through opening. The through opening is preferably releasably closed by a means of closure.

In a first variant of the invention, provision is made for a plug to be inserted in each of the one or plurality of through openings, which plug seals the through opening. The plug can have a sealing surface in the shape of a cylindrical periphery, which seals against the cylindrical inner surface of the through opening. However, provision can also be made for a sealing element, for example an O-ring, to be arranged between the peripheral wall of the plug and the inner wall of the through opening. The peripheral wall of the plug can also have an external thread, which is screwed into an internal thread of the wall of the through opening, or which has self-tapping threads. The plug can also have a head, whose diameter is larger than the diameter of the through opening, such that the plug can rest with the head on a floor surface of the central region of the support plate. In one variant of the invention, the support element, having a tubular shape, has a wall thickness such that the lower face of the support element completely closes the through opening. The lower face of the support element then forms a sealing surface. The gas channels extending through the support plate in each case open into an axial gas channel, which extends through the support element to open into the gas channels of the susceptor, that is to say the support piece. In particular, the support element is releasably connected to the support plate. The screw, with which the base plate is connected to the drive shaft, can be screwed into an internal thread of a flange element, which is attached to the drive shaft.

BRIEF DESCRIPTION OF THE DRAWINGS

In what follows, an example of an embodiment of the invention is explained with the aid of the accompanying figures. Here:

FIG. 1 shows a susceptor carrier 1 in perspective,

FIG. 2 shows the susceptor carrier represented in FIG. 1 in a side view,

FIG. 3 shows the cross-section along the line III-III in FIG. 2,

FIG. 3a shows the cross-section in FIG. 3 in perspective,

FIG. 4 shows a perspective view of the susceptor carrier 1 with a cut-out along the line IV-IV in FIG. 1, FIG. 5 shows a first exploded view, FIG. 6 shows a second exploded view, FIG. 13 shows a representation as in FIG. 11 of a fourth example of an embodiment of the invention.

DETAILED DESCRIPTION

Figure 7:
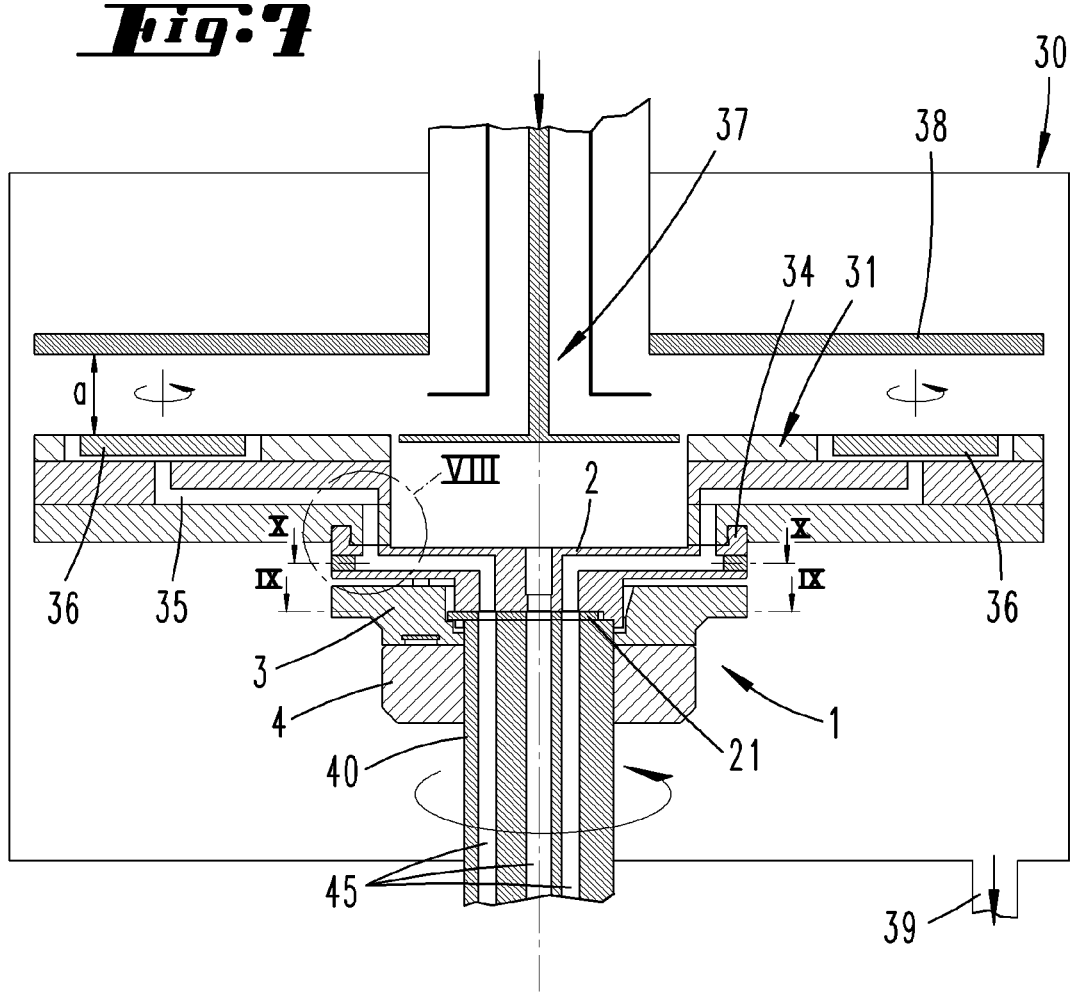
FIG. 7 shows in overview a cross-section of a reactor housing 30, in which a susceptor carrier 1 connects a drive shaft 40 with a susceptor 31.
Figure 8:
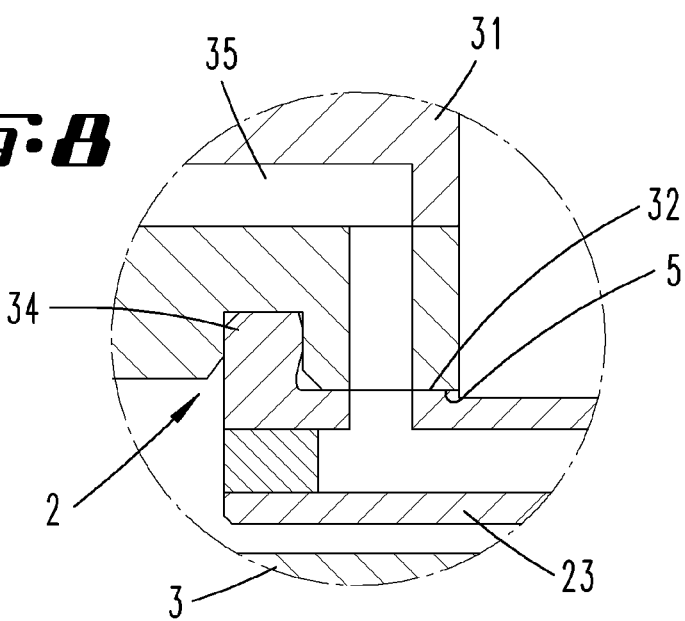
FIG. 8 shows the detail VIII in FIG. 7.
Figure 9:
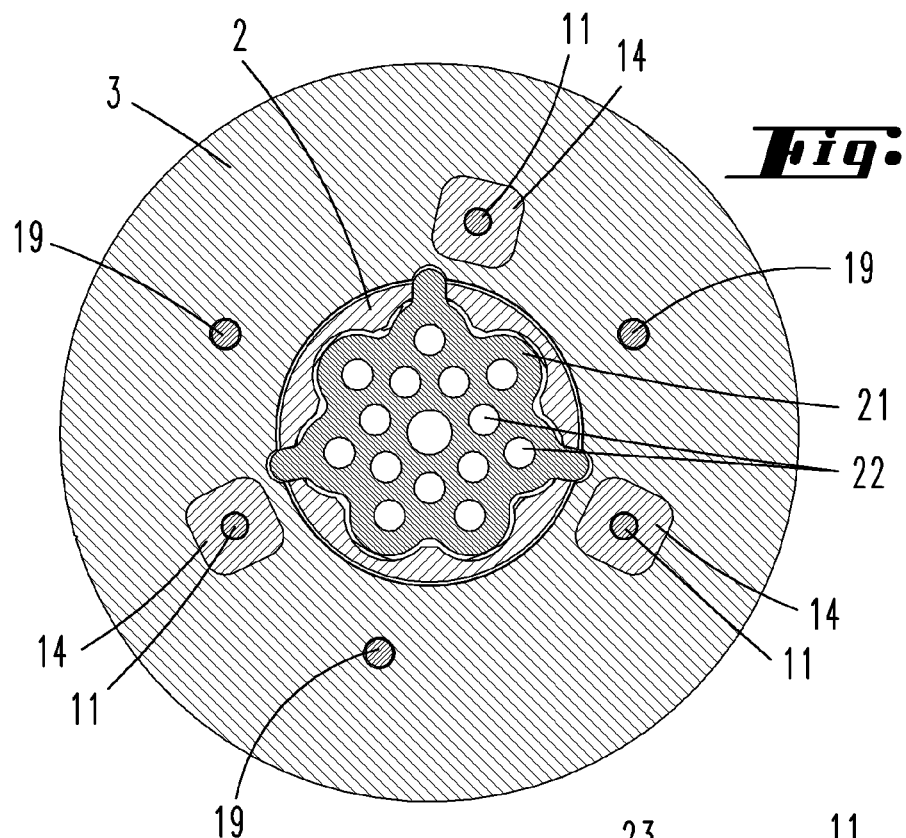
FIG. 9 shows the cross-section along the line IX-IX in FIG. 7.
Figure 10:
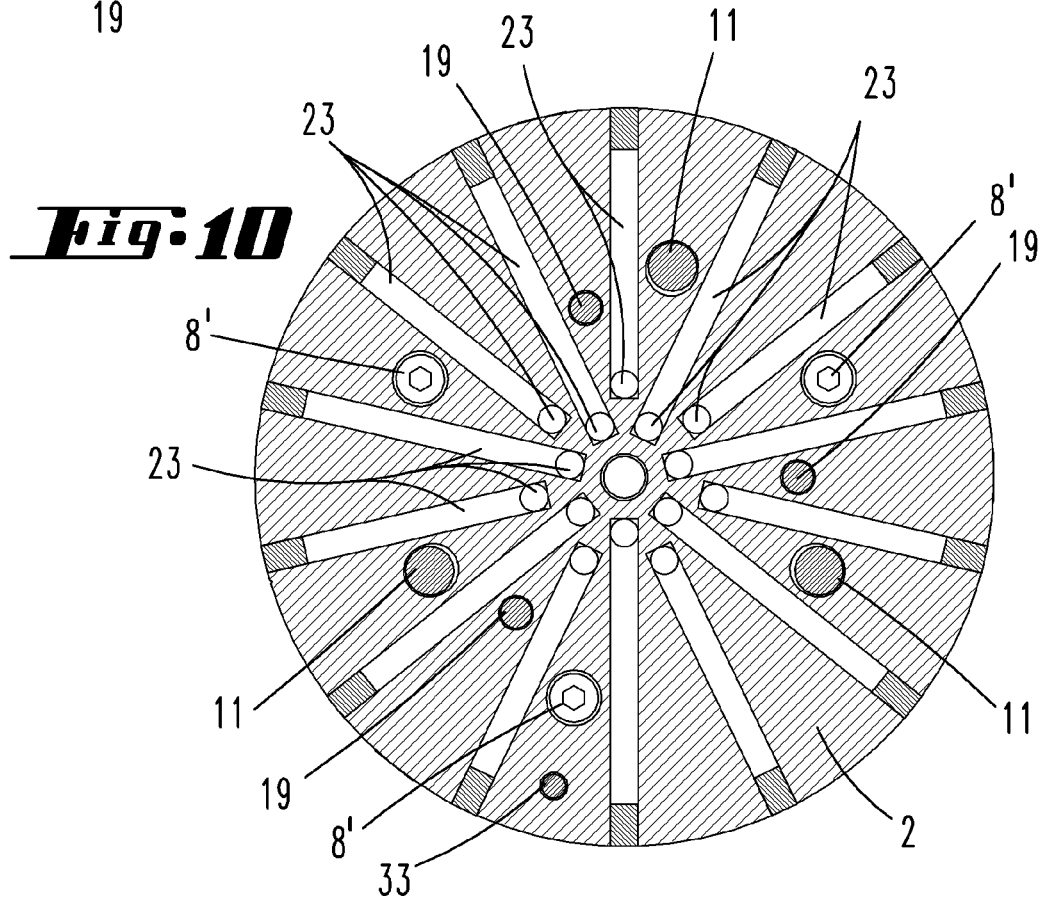
FIG. 10 shows the cross-section along the line X-X in FIG. 7.

An inventive CVD reactor has a reactor housing 30, which seals a process chamber arranged inside the reactor housing 30 from the environment in a manner impermeable to gas. A gas inlet device 37 is provided, with which process gases can be fed into the process chamber. Exhaust gases can exit the process chamber through a gas outlet 39. The process chamber can be evacuated by means of a pump connected to the gas outlet 39.

A hollow drive shaft 40 projects into the interior of the reactor housing 30, through which shaft an inert gas can flow. On an upper end of the drive shaft 40 is attached a susceptor carrier 1, which carries the susceptor 31. The susceptor 31 has a central opening, consists of graphite, in particular coated graphite, or a metal, has flow channels 35 extending in a radial direction away from the central opening, and one or a plurality of substrate carriers 36 arranged around the center of the susceptor 31. The substrate carriers 36 lie on a bearing surface, which can be the floor of a pocket. The flow channels 35 open into the bearing surface in such a way that the inert gas emerging from the flow channels 35 on the one hand forms a gas cushion, on which the substrate carriers 36 rest, and which at the same time causes the substrate carriers 36 to rotate. The susceptor 31 can be set in rotation by rotation of the drive shaft 40.

The gas inlet device 37 has a plurality of gas inlet channels for the introduction of a variety of process gases into the process chamber, which extends between an upper face of the susceptor 31 and a lower face of a cover plate 38. The process chamber height a between the lower face of the cover plate 38 and the upper face of the susceptor 31 is 20 to 50 mm, preferably 30 to 40 mm, and in one example embodiment, approximately 32 to 35 mm. The diameter of the cover plate 38 and the diameter of the susceptor 31 are greater than 30 cm.

The susceptor carrier 1 has means with which the inclined position of the susceptor 31 relative to the axis of the drive shaft 40 can be adjusted, such that the process chamber height a can be standardized over the entire periphery of the susceptor 31.

The susceptor carrier 1 has a flange element 4, which can be connected to the upward-facing end of the drive shaft 40. The flange element 4 takes the form of an annular body with a radial slot 26, which cuts through the ring. The two opposing halves of the ring of the flange element 4, formed by the slot, form clamping jaws 41, which can be moved towards each other by means of a clamping screw 25, wherein the gap 26 reduces. Further clamping screws 28 are provided, which can be screwed in a radial direction into threaded holes of the flange element 4. The threaded holes are assigned to the two clamping jaws 41. The tips of the clamping screws 28 can be supported on an outer peripheral surface of the drive shaft 40. However, provision can also be made for the rounded clamping jaws 41 to lie flat against the outer peripheral surface of the drive shaft 40, and to be held in a clamping fit by means of the clamping screw 25. The grub screws 28 then serve mainly to provide axial securing.

An upward-facing surface of the flange element 4 forms a bearing surface 4', which preferably lies exactly in a plane of rotation of the drive shaft 40. Three threaded holes 7 extend from the bearing surface 4', into which attachment screws 8 can be screwed.

A base plate 3 has a seating face 3", which can be placed flat on the bearing surface 4'. The base plate 3 can be connected to the flange element 4 by means of the attachment screws 8. For this purpose, the base plate 3 has mounting holes extending in the axial direction of the drive shaft 40, which have an upper section 9' with an enlarged diameter. The shaft of the screw 8 passes through the mounting hole 9 such that the head 8' of the screw 8 lies entirely in the upper section 9' of the mounting hole 9.

The base plate 3 has a central cavity, through which an upper section of the drive shaft 40 can project. While the drive shaft 40 projects into the central opening of the base plate from below, an extension 42 of a support plate 2 projects into the central cavity from above. The extension 42 forms a cavity that is open at the bottom, on the floor of which lies a seal 21. The end face of the drive shaft 40 abuts against the other face of the seal 21. The drive shaft 40 has a multiplicity of flow channels 45 running in the axial direction of the shaft.

Traction elements 11 are provided, which apply force to the support plate 2 in the direction of the base plate 3. In particular, three traction elements 11 are provided in an even peripheral distribution about the center of the support plate 2, that is to say, the base plate 3. The traction elements 11 generate a force, which is applied to the seal 21.

The seal 21 has a multiplicity of gas passage openings 22, which are aligned with gas inlet openings of gas channels 23, which extend inside the support plate 2. These gas inlet openings connect the gas channels 23 with gas outlet openings 24. The gas channels 23 have first sections which extend in the axial direction, and which open out into second sections, which extend in a radial direction. The second sections are closed with plugs with respect to the cylindrical peripheral outer wall of the support plate 2. The second sections open out into third sections, which extend in the axial direction and form the gas outlet openings 24, which are located in an end face of the support plate 2, through which openings an inert gas can flow into the flow channels 35 of the susceptor 31. The flow channels 45 are aligned with the gas passage openings 22, such that a gas can be fed into the support plate 2 through the flow channels 45.

The traction element 11 is formed by a threaded screw, which is inserted in a hole 12 of the support element 2, and which projects through a hole 13 of the base plate 3, and ends in a bearing recess 13' adjoining the hole 13. The end of the screw is screwed into a non-circular sliding block 14, which can move in an axial direction in the bearing recess 13'. The bearing recess 13' has a floor, on which a spring element 15 is supported. The spring element 15 is in turn loaded by the sliding block 14. In the example embodiment, the spring element 15 is formed by a compression spring element. The latter takes the form of plate springs stacked one above the other.

In a gap between the lower side 2' of the base plate 2 and the upper face 3' of the base plate 3 there extend three adjusting elements, each in the form of an adjusting lever 16. The adjusting lever 16 has a downward-facing bearing section 16', which is supported on the floor of a bearing recess 20. Three bearing recesses 20 are provided, each formed by a radial cut-out in the upper face 3'. The bearing recess 20 is a groove with a rectangular cross-section, which extends in a radial direction.

The adjusting lever 16 has a radially outward facing short lever arm 17, whose upward-facing extension engages with the edge of the lower face 2'. The long lever arm 18, which faces radially inwards, bears against an adjusting screw 19. The adjusting screw 19 takes the form of a grub screw, which is screwed into a threaded hole in a central region 6 of the support plate 2. The central region 6 is surrounded by a bearing surface 5, which is located opposite the lower face 2'. The bearing surface 5 is in turn surrounded by an annular web 34. A supporting face 32 of the susceptor 31 rests on the bearing surface 5. An orientation pin 33 for the rotational orientation of the susceptor 31 is inserted in an opening of the bearing surface 5. The gas outlet openings 24 are located in the bearing surface 5 and are aligned with gas inlet openings of the flow channel 35, which extends through the susceptor 31. The susceptor 31 is shown in the figures as a number of parts. However, it can also be designed in one piece.

In the center of the central region there is located a passage opening, which is aligned with an opening of the seal 21.

The adjusting means 19 for purposes of adjusting the inclined position of the support plate 2 relative to the base plate 3 can be adjusted using a suitable tool, for example a screwdriver. They are, in particular, accessible through the central opening of the susceptor 31.

In the event of a reinstallation of a susceptor, removed from the reactor housing 30, for example, for purposes of cleaning or replacement, the susceptor carrier 1 can firstly be initially adjusted outside the CVD reactor housing 30 by bringing the lower face of the base plate 3 into a position parallel to the bearing surface 5. The ensemble consisting of the support plate 2 and base plate 3 can subsequently be inserted into the reactor housing 30. The seating face 3" is positioned on the bearing surface 4' of the flange element 4. The bearing surface 4' preferably extends exactly in the plane of rotation of the drive shaft 40, such that the initially adjusted bearing surface 5 also lies in a plane of rotation of the drive shaft 40. The base plate 3 is attached to the flange element 4 by means of the screws 8 accessible from the central region 6, which are screwed into threaded holes 7 in the flange element 4. The attachment screws 8 are assigned through the through openings 10 of the support plate 2, which openings are aligned with the mounting holes 9 of the base plate 3 and the threaded holes 7 of the flange element 4.

It is considered advantageous if, by means of the three adjustment means 16, 17, 18, 19, the inclination of the bearing surface 5 can be adjusted in all directions relative to a figure axis of the base plate 3. The traction elements 11 generate a force, with which the edge of the support plate 2 abuts on the short arm 17 of the adjustment lever 16.

A fine adjustment is carried out after positioning the susceptor 31 on the support plate 2. Here the downward-facing supporting face 32 of the susceptor 31 is supported on the bearing surface 5. Through the central cavity of the susceptor 31, the adjusting element, in particular the adjusting screw 19, can be altered by means of suitable adjustment tools, such that the inclined position of the susceptor 31 alters, such that its upper face lies in the plane of rotation, and in particular parallel to the lower face of the process chamber cover 8.

Figure 11:
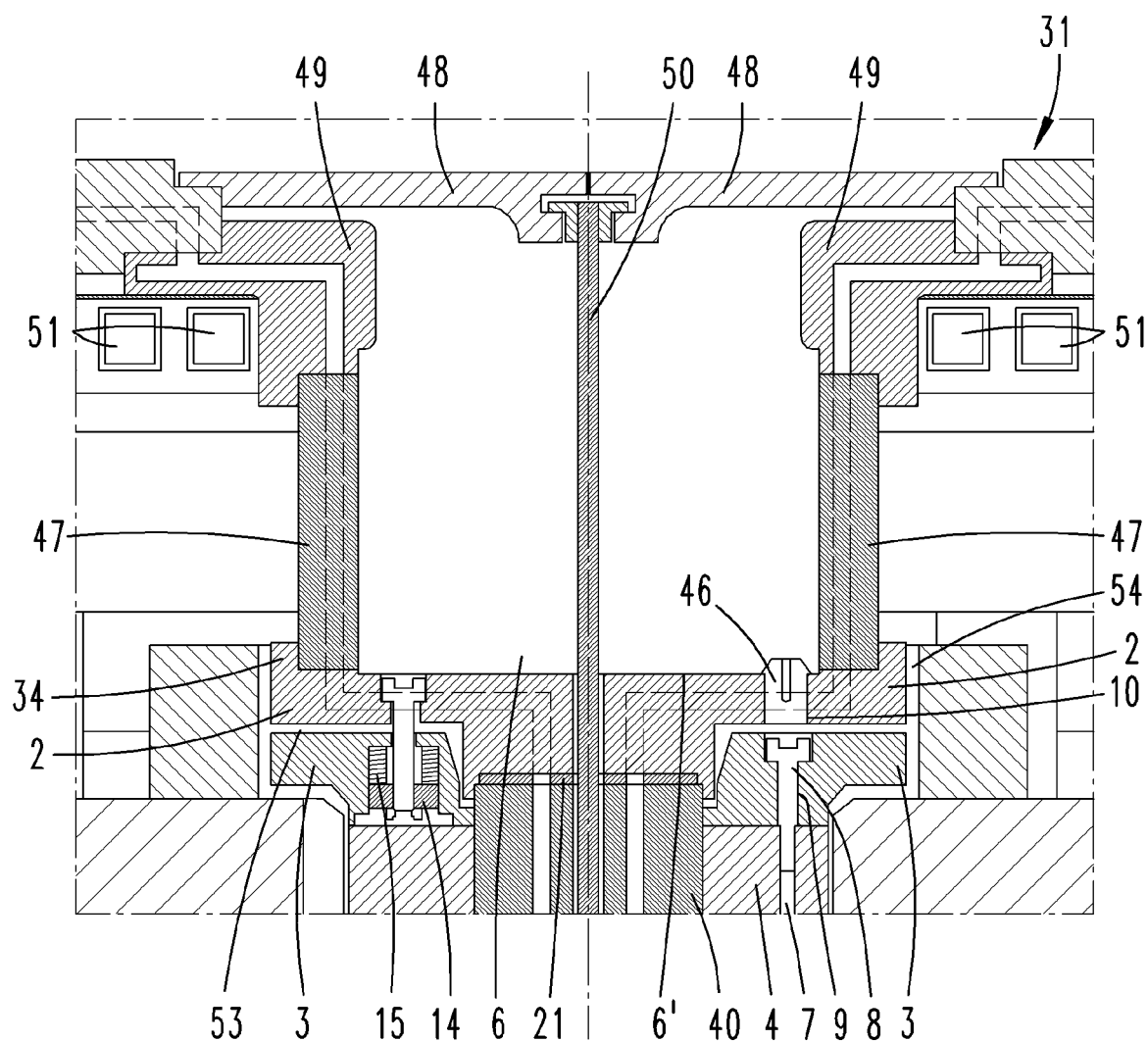
FIG. 11 shows a second example of an embodiment of the invention in the form of a cross-section through a susceptor carrier arrangement of a CVD reactor.
Figure 12:
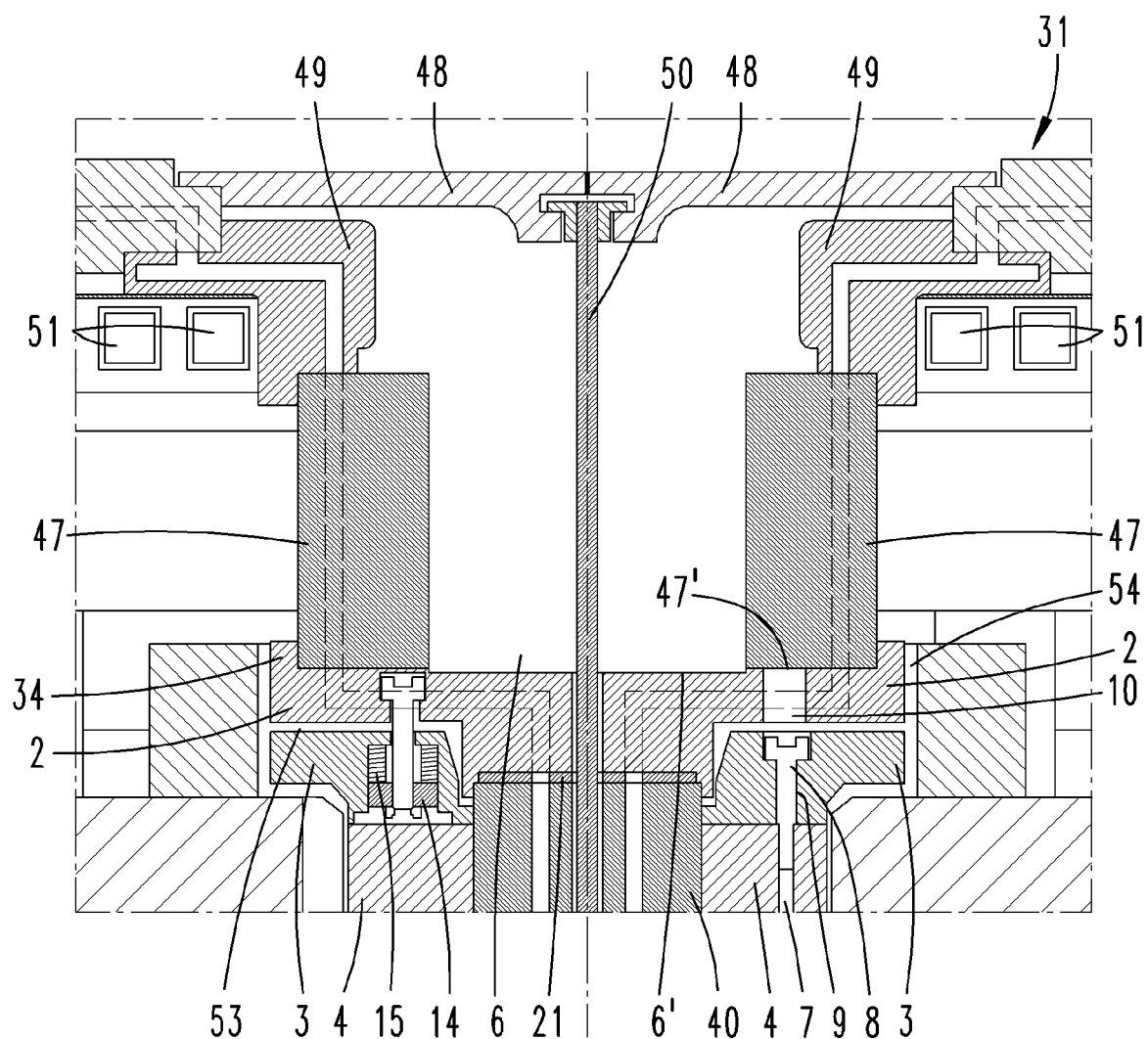
FIG. 12 shows a representation as in FIG. 11 of a third example of an embodiment of the invention.

FIGS. 11, 12 and 13 show a second aspect of the invention. A drive shaft 40 is connected to a base plate 3. The base plate 3 carries a support plate 2, wherein the measures already previously described are provided for purposes of adjusting the support plate relative to the base plate 3. For this purpose means of adjustment are provided, with which the inclined position of the support plate 2 relative to the base plate 3 can be adjusted.

As shown in FIGS. 1 to 8, already discussed above, the support plate 2 is spaced apart from the base plate 3 by a gap 53. This gap 53 extends in a horizontal plane and opens out into an annular gap 54, which surrounds the support plate 2, and opens into a space that extends underneath the susceptor 31. In this space there is located a heating element 51, with which a susceptor plate of the susceptor 31 is heated, which heating element has an annular design and is mounted on a support piece 49.

The support piece 49 is in turn supported by a tubular support element 47, which is supported on a floor surface 6' of the support plate 2. In the example embodiments shown in FIGS. 11 and 13, the support element 47 forms an annular cavity, into which through openings 10 open out, which are connected in terms of flow to the gap 53, such that the central cavity is connected in terms of flow to the space underneath the susceptor 31.

On an annular edge of the susceptor plate rests the annular edge of a tensioning piece 48, which with a tensioning element 50 is connected to the drive shaft 40, or to a tensioning means arranged below the drive shaft 40, so as to exert a tension on the tensioning element 50. In the example embodiment, the tensioning piece 48 is formed by a tensioning plate.

With the plug 46 shown in FIG. 11, the through opening 10, which is aligned with a mounting hole 9, in which an attachment screw 8 is inserted, is closed, as is the flow connection between the central cavity and the space underneath the susceptor 31. In the course of assembly, the attachment screw 8 can be inserted through the through hole 10 into the mounting hole 9. The threaded section of the attachment screw 8 is then screwed into a threaded hole 7 in a flange element 4, which is attached to the drive shaft 40. The means of closure shown in the figures close the through openings 10 in a releasable manner.

The plug 46 has a cylindrical sealing region, which engages with the through opening 10. With an elastic contact force the sealing region abuts against the wall of the cylindrical through opening 10. A head of the plug 46 has regions projecting radially beyond the sealing surface, which can abut against the floor surface 6' in order to hold the plug 10 in an axial position in the mounting hole 9.

The example embodiment shown in FIG. 13 essentially differs from the example embodiment shown in FIG. 11 in that the means of sealing is an O-ring 52, which is inserted in an annular groove in the cylindrical peripheral surface of the plug 46. The compressed O-ring 52 can be supported in a sealing manner on the wall of the through opening 10.

In the example embodiment shown in FIG. 12, the tubular support element 47 has a wall thickness such that a lower face of the support element 47 forms a sealing surface 47' that completely closes the through opening 10. The radial extent of the central opening below the tensioning piece 48, through which the tensioning element 50 extends, that is to say, its diameter, is smaller in the example of embodiment shown in FIG. 12 than in the example embodiments shown in FIGS. 11 and 13.

In other example embodiments that are not shown, the plug can have alternative configurations. It can, for example, have an external thread, which is screwed into an internal thread of the wall of the through opening 10. Here it can take the form of a self-sealing thread. In an alternative, the plug can also have a self-tapping thread, which cuts into the smooth wall of the through opening 10 as the plug 46 is screwed in. In addition, the enlarged diameter edge of the head can form a sealing surface.

The above statements serve to explain the inventions recorded by the application as a whole, which develop the prior art at least by means of the following combinations of features, and in each case also independently, wherein two, a plurality, or all, of these combinations of features can also be combined, namely:

A device, which is characterized by a flange element 4 carried by the drive shaft 40, and/or attachable to the drive shaft 40, to which the base plate 3 is attached, or is attachable, with releasable means of attachment 7, 8, 9.

A device, which is characterized in that the fasteners 7, 8, 9 have a plurality of screws 8, which are inserted into mounting holes 9 of the base plate 3, and are screwed into threaded holes 7 of the flange element 4.

A device, which is characterized in that the attachment screws 8 have heads 8', which are inset in enlarged diameter sections 9' of the mounting holes 9.

A device, which is characterized in that an end face of the support plate 2, facing away from the base plate 4, has a central region 6, in which are arranged through openings 10 for the insertion of the attachment screws 8.

A device, which is characterized in that the bearing surface 5 surrounds the central region 6.

A device, which is characterized by means of adjustment 16, 17, 18, 19 for purposes of adjusting the inclination of the bearing surface 5 relative to a seating face 3" of the base plate 3, which rests, and/or can rest, on a bearing surface 4' of the flange element.

A device, which is characterized in that the flange element 4 has clamping elements 25, 28, 41 with which to be attached on an outer peripheral surface of the drive shaft 40.

A device, which is characterized in that the flange element 4 has two clamping jaws 41, which can be moved towards each other with a clamping device 25.

A device, which is characterized in that the flange element 4 has one or a plurality of clamping screws 28, which can be brought against the outer peripheral surface of the drive shaft 4 in a radial direction.

A device, which is characterized in that the means of adjustment are adjusting levers 16, which are supported on the base plate 3, and engage with a short lever arm 17 on the lower face 2' of the support plate 2, and which have a long lever arm 18, on which an adjusting screw 19, screwed into a threaded hole of the central region 6, acts.

A device, which is characterized by traction elements 11, 14, 15 applying force through the support plate 2 in the direction onto the base plate 3.

A device, which is characterized by gas channels 23 arranged in the support plate 2, which interconnect gas inlet openings assigned to a lower face 2' of the support plate 2 with gas outlet openings 24.

A device, which is characterized by a flexible seal 21, inset in a cavity 43 of an extension 42 assigned to the lower face 2' of the support plate 2, which has gas passage openings 22 aligned with the gas inlet openings, and which can rest on the end face of the drive shaft 40.

A device, which is characterized by an annular web 34 surrounding the bearing surface 5.

A device, which is characterized by a position-adjusting element 33 arranged in the region of the bearing surface 5, in particular in the form of an orientation pin.

A CVD reactor, characterized in that the susceptor 31 is connected to the drive shaft 40 with a device according to one of the claims 1 to 15, wherein the susceptor 31 has a central opening, which is surrounded by the supporting face 32, and whose diameter approximately corresponds to the diameter of the central region 6.

A device, which is characterized by the attachment of a susceptor 31 of a CVD reactor to a drive shaft 40, with three elements arranged one above the other in the axial direction of the drive shaft 40, wherein a lower element is connected to the drive shaft 40 and carries a central element, and the central element is arranged between the lower and an upper element, wherein the upper element can be adjusted in position relative to the central element, and has means for the attachment of the susceptor 31.

A device, which is characterized by at least one means of closure 46, 47', with which the through opening 10 is closed.

A device, which is characterized in that the means of closure is formed by a plug 46, which engages with the through opening 10 in a sealing manner, or in that the means of closure is a sealing surface 47', which is formed by a support element 47 carrying the susceptor 31 and supported on the support plate 2.

All disclosed features are essential to the invention (both individually, and also in combination with one another). In the disclosure of the application, the disclosure content of the associated/attached convention documents (transcript of the prior application) is hereby also incorporated in full, also for the purpose of incorporating features of these documents in the claims of the present application. The subsidiary claims characterise, even without the features of a claimed claim, with their features independent inventive developments of the prior art, in particular in order to make divisional applications on the basis of these claims. The invention prescribed in each claim can additionally comprise one or a plurality of the features described in the above description, in particular with features provided with reference symbols and/or prescribed in the list of reference symbols. The invention also relates to forms in which individual of the features mentioned in the above description are not implemented, in particular insofar as they are recognizably dispensable for the respective purpose, or can be replaced by other technically equivalent means.

LIST OF REFERENCE SYMBOLS

1 Susceptor carrier
2 Support plate
2' Lower face
3 Base plate
3' Upper face
3" Seating face
4 Flange element
4' Bearing surface
5 Bearing surface
6 Central region
6' Floor surface
7 Threaded hole
8 Screw
8' Head
9 Mounting hole
9' Section
10 Through opening
11 Traction element
12 Hole
13 Hole
13' Bearing recess
14 Sliding block
15 Spring element
16 Adjusting lever
16' Bearing section
17 Lever arm
18 Lever arm
19 Adjusting screw
20 Bearing recess
21 Seal
22 Gas passage opening
23 Gas channel
24 Gas outlet opening
25 Clamping element
26 Gap
27 Threaded hole
28 Clamping device, clamping screw
29 Cavity
30 Reactor housing
31 Susceptor
32 Supporting face
33 Orientation pin
34 Annular web
35 Flow channel
36 Substrate carrier
37 Gas inlet device
38 Cover plate
39 Gas outlet
40 Drive shaft
41 Clamping jaw
42 Extension
43 Cavity
44 Clamping ring
45 Flow channel
46 Plug
47 Support element
47' Sealing surface
48 Tensioning piece
49 Support piece
50 Tensioning element
51 Heating element
52 O-ring 53 Gap
54 Gap
a Process chamber height

The invention claimed is:

1. A device for attaching a susceptor (31) of a chemical vapor deposition (CVD) reactor to a drive shaft (40), the device comprising:
   a support plate (2) with a bearing surface (5), on which a supporting face (32) of the susceptor (31) rests;
   a flange element (4);
   a base plate (3) that is connected by the flange element (4) to the drive shaft (40); and
   adjustment means (16, 17, 18, 19) for adjusting an inclination of the bearing surface (5) of the support plate (2) relative to a seating face (3") of the base plate (3),
   wherein the adjustment means (16, 17, 18, 19) comprise adjustment levers (16) each having a first lever arm (17) and a second lever arm (18) and being located between the base plate (3) and the support plate (2).

2. The device of claim 1, further comprising traction elements (11, 14, 15) configured to apply force through the support plate (2) in a direction towards the base plate (3).

3. The device of claim 1, further comprising a position-adjusting element (33), in a form of an orientation pin, arranged in a region of the bearing surface (5) of the support plate (2).

4. The device of claim 1,
   wherein the device is part of the chemical vapor deposition (CVD) reactor, the CVD reactor comprising (i) a reactor housing (30), (ii) the susceptor (31) and (iii) the drive shaft (40),
   wherein the drive shaft (40) is configured to carry and rotate the susceptor (31),
   wherein the susceptor (31) has a central opening that is surrounded by the supporting face (32) of the susceptor (31), and
   wherein a diameter of the supporting face (32) approximately corresponds to a diameter of the central region (6) of the support plate (2).

5. The device of claim 1, further comprising:
   releasable means of attachment (7, 8, 9) for attaching the base plate (3) to the flange element (4),
   wherein the flange element (4) comprises clamping devices (25, 28, 41) with which the flange element (4) is attached to an outer peripheral surface of the drive shaft (40).

6. The device of claim 5, wherein the releasable means of attachment (7, 8, 9) has a plurality of attachment screws (8) that are inserted into attachment holes (9) of the base plate (3), and are screwed into threaded holes (7) of the flange element (4).

7. The device of claim 6, wherein the attachment screws (8) have heads (8') that are inset in enlarged diameter sections (9') of the attachment holes (9).

8. The device of claim 6, wherein an end face of the support plate (2), facing away from the base plate (3), has a central region (6), in which through openings (10) for the insertion of the attachment screws (8) are arranged.

9. The device of claim 8, wherein the bearing surface (5) of the support plate (2) surrounds the central region (6).

10. The device of claim 8, further comprising an adjusting screw (19) that is screwed into a threaded hole of the central region (6) of the support plate (2), wherein the adjustment levers (16) are supported on the base plate (3), wherein the first lever arm (17) of each of the adjustment levers (16) engages on a lower face (2') of the support plate (2), and wherein the adjusting screw (19) acts on one of the second lever arms (18) of the adjustment levers (16).

11. The device of claim 5, further comprising clamping devices (25, 28, 41) configured to attach the flange element (4) to an outer peripheral surface of the drive shaft (40).

12. The device of claim 5, wherein the flange element (4) has two clamping jaws (41) that are moveable towards each other with a clamping device (25).

13. The device of claim 5, wherein the flange element (4) has one or more clamping screws (28) that are displaceable against an outer peripheral surface of the drive shaft (4) in a radial direction.

14. The device of claim 5, further comprising an annular web (34) that surrounds the bearing surface (5) of the support plate (2).

15. A device for attaching a susceptor (31) of a chemical vapor deposition (CVD) reactor to a drive shaft (40), the device comprising:
   a support plate (2) with a bearing surface (5), on which a supporting face (32) of the susceptor (31) rests, wherein the support plate (2) comprises gas channels (23) interconnecting gas inlet openings disposed on a lower face (2') of the support plate (2) with gas outlet openings (24) of the bearing surface (5);
   a flange element (4);
   a base plate (3) that is connected by the flange element (4) to the drive shaft (40);
   releasable means of attachment (7, 8, 9) for attaching the base plate (3) to the flange element (4) and supporting the supporting plate (2) in an adjustable position to the base plate (3); and
   a seal (21) inset in a cavity (43) of an extension (42) extending from a lower face (2') of the support plate (2), wherein the seal (21) rests on an end face of the drive shaft (40), wherein the seal (21) has gas passage openings (22) that are aligned with the gas inlet openings of the support plate (2), and wherein the seal (21) comprises a flexible material.

16. The device of claim 15, further comprising adjustment means (16, 17, 18, 19) for adjusting an inclination of the bearing surface (5) of the support plate (2) relative to a seating face (3") of the base plate (3), wherein the support plate (3) rest on a bearing surface (4') of the flange element (4).

17. The device of claim 15, wherein the releasable means of attachment (7, 8, 9) has a plurality of attachment screws (8) that are inserted into attachment holes (9) of the base plate (3), and are screwed into threaded holes (7) of the flange element (4).

* * * * *